United States Patent
Pankiang et al.

(10) Patent No.: US 11,832,055 B2
(45) Date of Patent: Nov. 28, 2023

(54) PIEZOELECTRIC SOUND-PRODUCING COMPONENT

(71) Applicant: Murata Manufacturing Co., Ltd., Nagaokakyo (JP)

(72) Inventors: Wilai Pankiang, Nagaokakyo (JP); Tawatchai Muangoad, Nagaokakyo (JP); Sahutboon Kittayawanich, Nagaokakyo (JP)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 191 days.

(21) Appl. No.: 17/367,902

(22) Filed: Jul. 6, 2021

(65) Prior Publication Data

US 2021/0337315 A1  Oct. 28, 2021

Related U.S. Application Data

(63) Continuation of application No. PCT/JP2020/004305, filed on Feb. 5, 2020.

(30) Foreign Application Priority Data

Apr. 25, 2019 (JP) ................ 2019-083659

(51) Int. Cl.
*H04R 17/00* (2006.01)
*H04R 1/02* (2006.01)
*H04R 3/00* (2006.01)
*H04R 7/04* (2006.01)
*H04R 7/18* (2006.01)
*G10K 9/122* (2006.01)

(52) U.S. Cl.
CPC ............ *H04R 17/00* (2013.01); *H04R 1/025* (2013.01); *H04R 3/00* (2013.01); *H04R 7/04* (2013.01); *H04R 7/18* (2013.01); *G10K 9/122* (2013.01)

(58) Field of Classification Search
None
See application file for complete search history.

(56) References Cited

FOREIGN PATENT DOCUMENTS

JP  2001128291 A  *  5/2001
JP  2001128291 A     5/2001

OTHER PUBLICATIONS

International Search Report issued for PCT/JP2020/004305, dated Mar. 31, 2020.
Written Opinion of the International Searching Authority issued for PCT/JP2020/004305, dated Mar. 31, 2020.

* cited by examiner

*Primary Examiner* — Walter F Briney, III
(74) *Attorney, Agent, or Firm* — ArentFox Schiff LLP (57) ABSTRACT

A piezoelectric sound-producing component includes a piezoelectric diaphragm, a base, and a housing that is combined with the base and thereby accommodates the piezoelectric diaphragm. The base includes a bottom wall and a protrusion, and the housing includes a top wall and a circumferential wall. The circumferential wall has a hook portion configured to lock the protrusion. At least one slit is formed in the circumferential wall so as to extend from an end of the housing at an opening of the housing. When L denotes the length of the at least one slit in the height direction and Tc denotes the length of the housing in the height direction, the piezoelectric sound-producing component satisfies a relation L<0.35×Tc.

18 Claims, 7 Drawing Sheets

PIEZOELECTRIC SOUND-PRODUCING COMPONENT

CROSS REFERENCE TO RELATED APPLICATIONS

The present application is a continuation of PCT/JP2020/004305 filed Feb. 5, 2020, which claims priority to Japanese Patent Application No. 2019-083659, filed Apr. 25, 2019, the entire contents of each of which are incorporated herein by reference.

TECHNICAL FIELD

The present invention relates to a piezoelectric sound-producing component.

BACKGROUND

Piezoelectric sound-producing components are used as electroacoustic transducers that produce a warning sound or an operation sound, for example, in an automobile and in an electronic appliance for business or general use, such as a home appliance or a fire alarm. A so-called "pin-type" piezoelectric sound-producing component having a needle-like mounting terminal includes, for example, a piezoelectric diaphragm, a base, and a housing to be fitted to the outer surface of the base. The base and the housing accommodate the piezoelectric diaphragm. The piezoelectric diaphragm is retained in the interior space formed between a bottom wall of the base and a top wall of the housing in such a manner that a circumferential portion of the piezoelectric diaphragm is nipped by the base and the housing.

For example, Japanese Unexamined Patent Application Publication No. 2001-128291 (hereinafter "Patent Document 1") discloses a piezoelectric sound-producing component in which at least one slit is formed in each of a standing wall of the base and a circumferential wall of the housing. In this piezoelectric sound-producing component, when the base and the housing are fitted to each other, the slit of the standing wall and the slit of the circumferential wall are aligned with each other and thereby forms a vent hole through which the inside of the piezoelectric sound-producing component communicates with the outside.

Moreover, the base and the housing of the piezoelectric sound-producing component according to Patent Document 1 have respective slits formed therein. Accordingly, the base and the housing are vulnerable to deformation, which may lead to a decrease in the connection strength between the base and the housing. For example, when the piezoelectric sound-producing component is mounted by flow soldering, the base and the housing are deformed due to the heat. If the amount of deformation of the housing is greater than that of the base, the connection strength may be decreased, and the housing may come off the base.

SUMMARY OF THE INVENTION

Accordingly, it is an object of the present invention to provide a piezoelectric sound-producing component with improved reliability.

Thus, a piezoelectric sound-producing component is provided according to an exemplary aspect that includes a piezoelectric diaphragm, a base having a terminal that electrically couples the piezoelectric diaphragm with an external device, and a housing that is combined with the base and thereby accommodates the piezoelectric diaphragm. In this aspect, the base includes a bottom wall having an upper surface that opposes the piezoelectric diaphragm with a space interposed therebetween and also includes a protrusion that protrudes outward from the bottom wall when the upper surface is viewed in plan. The housing includes a top wall having a lower surface that opposes the piezoelectric diaphragm with a space interposed therebetween and also includes a circumferential wall that extends in a height direction of the piezoelectric sound-producing component. The circumferential wall has a hook or hook portion configured to lock the protrusion of the base. At least one slit is formed in the circumferential wall of the housing so as to extend from an end of the housing at an opening of the housing. In this aspect, L denotes a length of the at least one slit in the height direction of the piezoelectric sound-producing component and Tc denotes a length of the housing in the height direction of the piezoelectric sound-producing component. According to the exemplary aspect, the piezoelectric sound-producing component is constructed to satisfy the relation $L<0.35 \times Tc$.

Moreover, a piezoelectric sound-producing component is provided according to another aspect that includes a piezoelectric diaphragm, a base having a terminal that electrically couples the piezoelectric diaphragm with an external device, and a housing that is combined with the base and thereby accommodates the piezoelectric diaphragm. The base includes a bottom wall having an upper surface that opposes the piezoelectric diaphragm with a space interposed therebetween, a protrusion that protrudes outward from the bottom wall when the upper surface is viewed in plan, and a standing wall that extends in a height direction of the piezoelectric sound-producing component. Moreover, the housing includes a top wall having a lower surface that opposes the piezoelectric diaphragm with a space interposed therebetween and also includes a circumferential wall that extends in the height direction of the piezoelectric sound-producing component. The circumferential wall has a hook portion configured to lock the protrusion of the base. At least one slit is formed in the circumferential wall of the housing so as to extend from an end of the housing at an opening of the housing. When the housing is combined with the base, an upper end of the at least one slit is positioned below a top end of the standing wall.

The exemplary embodiments of the present invention provide the piezoelectric sound-producing component with improved reliability.

DETAILED DESCRIPTION OF EMBODIMENTS

Exemplary embodiments of the present invention will be described with reference to the drawings. The drawings provided for illustrating embodiments are merely examples in which dimensions and shapes of elements are presented schematically, and accordingly the technical scope of the present invention should not be construed as being limited to the illustrated embodiments.

First Exemplary Embodiment

Figure 1:
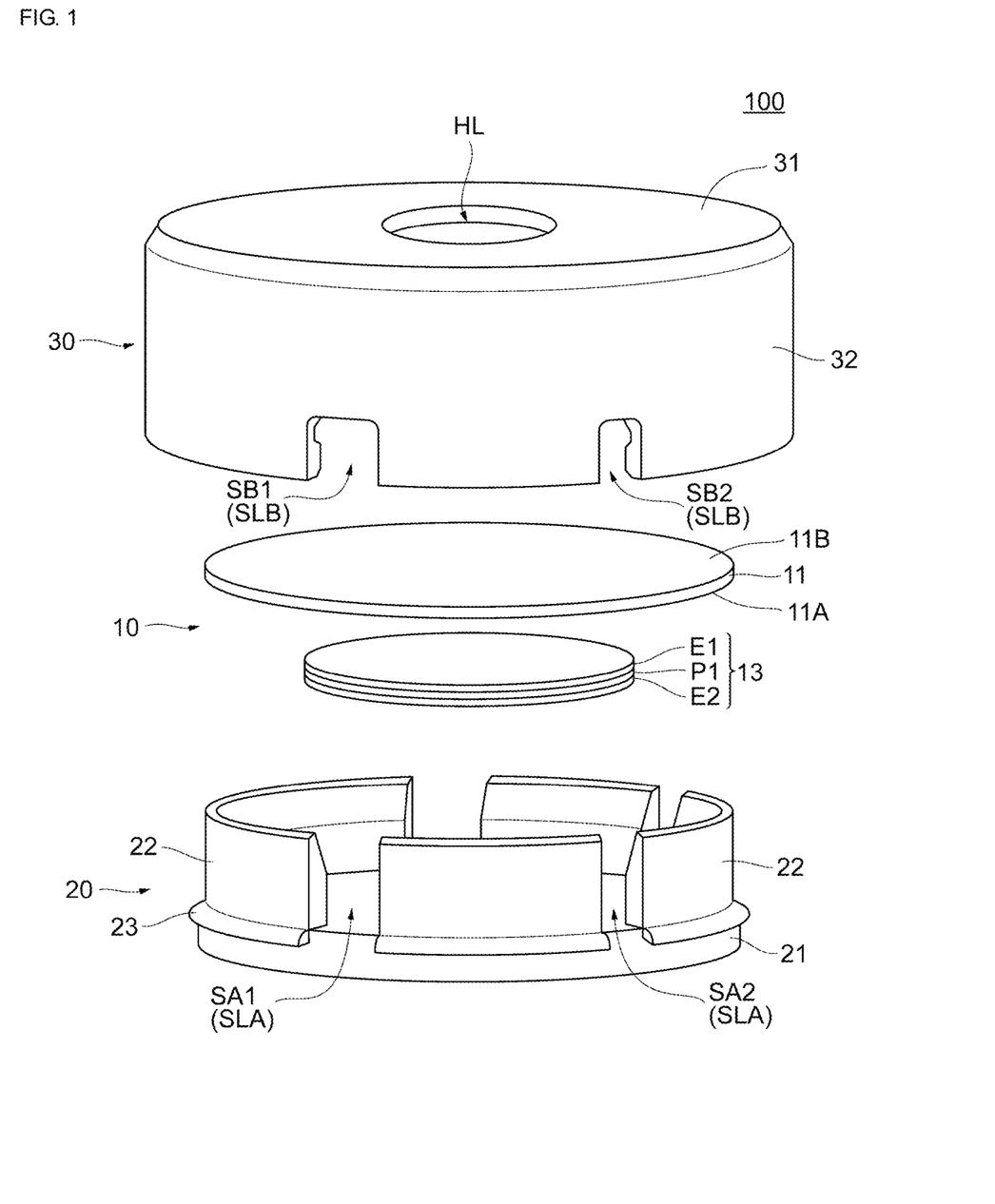
FIG. 1 is an exploded perspective view schematically illustrating a structure of a piezoelectric sound-producing component according to a first exemplary embodiment.
Figure 2:
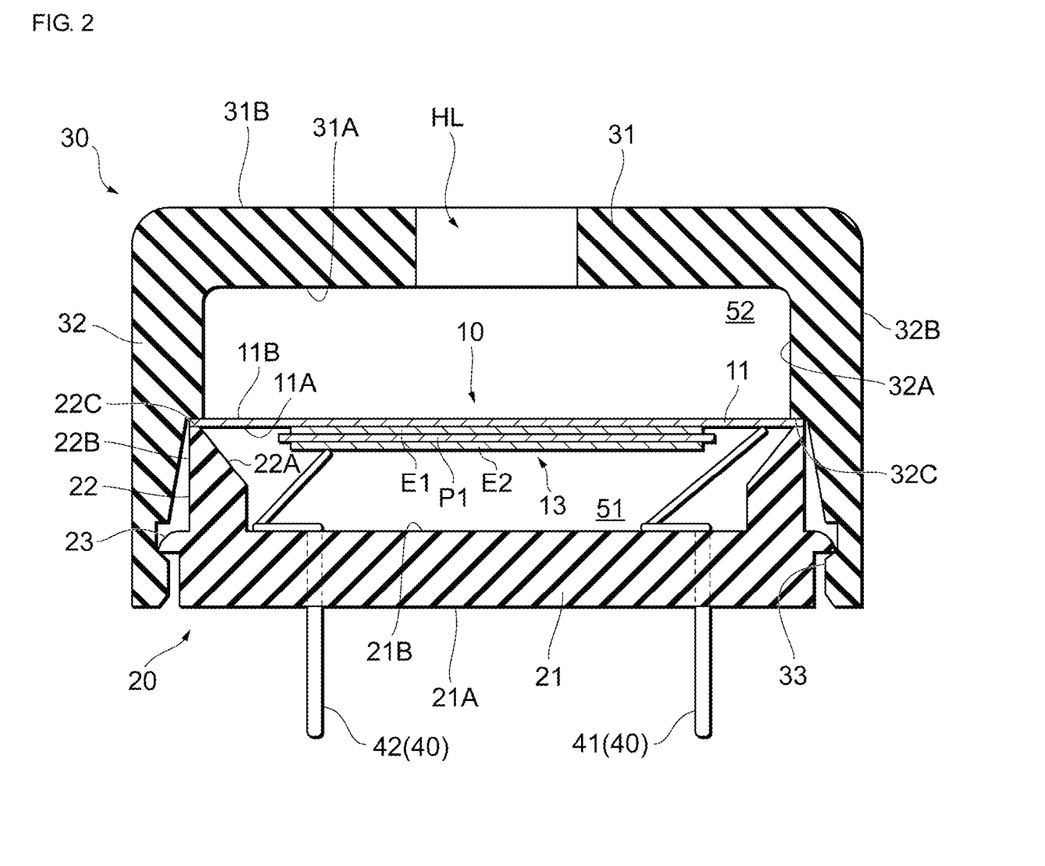
FIG. 2 is a cross-sectional view schematically illustrating the structure of the piezoelectric sound-producing component according to the first exemplary embodiment.

Referring to FIGS. 1 and 2, a structure of a piezoelectric sound-producing component 100 according to a first embodiment will be described. FIG. 1 is an exploded perspective view schematically illustrating the structure of the piezoelectric sound-producing component according to the first embodiment. FIG. 2 is a cross-sectional view schematically illustrating the structure of the piezoelectric sound-producing component according to the first embodiment.

As shown, the piezoelectric sound-producing component 100 includes a piezoelectric diaphragm 10, a base 20, a housing 30, and a mounting terminal 40. The piezoelectric diaphragm 10 includes a diaphragm 11 and a piezoelectric vibrator element 13. The base 20 includes a bottom wall 21, a standing wall 22, and a protrusion 23. The housing 30 includes a top wall 31, a circumferential wall 32, and a hook portion 33 (or simply a "hook"). In one aspect, the hook portion 33 can be considered an indentation extending into the inner surface of the housing 30 and constructed to receive the protrusion 23. Moreover, the mounting terminal 40 includes a first terminal 41 and a second terminal 42. Further details will be described later. According to the exemplary aspect, the piezoelectric sound-producing component 100 is a so-called "pin-type" sound-producing component of which the first terminal 41 and the second terminal 42 are to be inserted into an external circuit board and connected thereto by soldering.

In the description of the exemplary embodiments, the height direction of the piezoelectric sound-producing component 100 is defined as the direction normal to an upper surface 21B of the bottom wall 21. In addition, a direction from the bottom wall 21 to the top wall 31 is referred to as an "upward direction", whereas a direction from the top wall 31 to the bottom wall 21 is referred to as a "downward direction". A circumferential direction of an element is a direction along the circumference of the element when the element is viewed in plan in the upward or downward direction. A radial direction of an element is a direction that extends so as to intersect the circumference of the element and passes through the geometric center of the element as viewed in plan in the upward or downward direction.

To begin with, the structure of the piezoelectric diaphragm 10 is described.

Specifically, the piezoelectric diaphragm 10 is accommodated in the interior space inside an assembly of the base 20 and the housing 30. The piezoelectric diaphragm 10 is a diaphragm having a circumferential portion nipped by the base 20 and the housing 30 with a central portion of the diaphragm being able to vibrate flexurally in an out-of-plane direction. The interior space formed in the assembly of the base 20 and the housing 30 is divided into a lower space 51 and an upper space 52 by the piezoelectric diaphragm 10. In other words, in the piezoelectric sound-producing component 100, the lower space 51 is surrounded by the piezoelectric diaphragm 10 and the base 20, and the upper space 52 is surrounded by the piezoelectric diaphragm 10 and the housing 30.

The diaphragm 11, which is shaped like a thin plate, has a lower surface 11A and an upper surface 11B that are disposed opposite to each other. The lower surface 11A of the diaphragm 11 opposes the bottom wall 21, and the upper surface 11B of the diaphragm 11 opposes the top wall 31. For example, the diaphragm 11 is shaped substantially circularly when the lower surface 11A of the diaphragm 11 is viewed in a plan view of the surfaces. It is noted, however, that the shape of the diaphragm 11 as viewed in plan view is not limited to this but may be an oval, a polygon, or a combination thereof. For example, the diaphragm 11 is a metal plate made of brass, nickel, iron-nickel alloy (42Ni—Fe), or stainless steel. The material of the diaphragm 11 is not limited to these, but may be others insofar as the diaphragm 11 can vibrate flexurally in an out-of-plane direction. The diaphragm 11 can be made of an organic material, such as a liquid crystalline polymer, or an inorganic material, such as a metallic compound. Moreover, the diaphragm 11 may have a layered structure formed by laminating multiple materials.

The piezoelectric vibrator element 13 is an electromechanical transducer element that is caused to vibrate in response to an electric signal being input via the mounting terminal 40. The piezoelectric vibrator element 13 is joined to the lower surface 11A of the diaphragm 11 at the central portion thereof. The piezoelectric vibrator element 13 flexurally vibrates the piezoelectric diaphragm 10 up and down in an out-of-plane direction. The piezoelectric vibrator element 13 includes a first electrode E1, a piezoelectric film P1, and a second electrode E2. The first electrode E1 and the second electrode E2, which form a pair of driving electrodes, oppose each other in the height direction with the piezoelectric film P1 interposed therebetween. The first electrode E1 is disposed on the surface of the piezoelectric film P1 that faces the diaphragm 11, whereas the second electrode E2 is disposed on the other surface of the piezoelectric film P1 that is opposite to the surface facing the diaphragm 11. As viewed in plan, the piezoelectric film P1 is larger than any of the first electrode E1 and the second electrode E2. In other words, each of the first electrode E1 and the second electrode E2 is positioned in an inner region of the surface of the piezoelectric film P1. Moreover, the piezoelectric vibrator element 13 is joined to the diaphragm 11 using an electroconductive adhesive (not illustrated). Accordingly, the first electrode E1 is electrically connected to the diaphragm 11. It is also noted that in the case of the diaphragm 11 being made of an electroconductive material, such as a metallic plate, the diaphragm 11 can serve as an electrode, which can eliminate the first electrode E1.

For example, in the exemplary aspect the piezoelectric film P1 is a piezoelectric ceramic film that is made of a perovskite oxide, such as a titanate-based perovskite oxide, for example, lead zirconate titanate ($Pb(Zr_xTi_{1-x})O_3$; PZT), or a niobate-based perovskite oxide, for example, lithium niobate ($LiNbO_3$). However, it is noted that the material of the piezoelectric film P1 is not limited to these but may be a piezoelectric substance other than the ceramic material, such as a crystal film or a piezoelectric polymer membrane.

For example, the first electrode E1 and the second electrode E2 are made of a metallic material, such as a nickel-copper alloy (NiCu) or silver (Ag). The material of the first electrode E1 and the second electrode E2 is not limited to these, but may be, for example, an electroconductive resin, an electroconductive ceramic material, or a degenerated semiconductor. As viewed in plan, the piezoelectric film P1, the first electrode E1, and the second electrode E2 are shaped substantially circularly and disposed concentrically. The shapes of the piezoelectric film P1, the first electrode E1, and the second electrode E2 as viewed in plan are not limited to these but may be ovals, polygons, or combinations thereof. Moreover, the shapes of the piezoelectric film P1, the first electrode E1, and the second electrode E2 as viewed in plan may be different from each other.

Next, a structure of the base 20 will be described.

Specifically, the base 20 is a lower half portion of a container that is formed by fitting the base 20 and the housing 30 to each other and that retains the piezoelectric diaphragm 10 therein. The piezoelectric sound-producing component 100 is to be mounted onto an external circuit board with the base 20 facing the external circuit board.

The bottom wall 21 and the piezoelectric diaphragm 10 form the lower space 51 therebetween. The bottom wall 21, which is shaped tabularly, has a lower surface 21A and an upper surface 21B that are disposed opposite to each other. The lower surface 21A faces the outside of the piezoelectric sound-producing component 100. The upper surface 21B faces the interior space (i.e., the lower space 51) of the piezoelectric sound-producing component 100 and opposes the piezoelectric diaphragm 10 in the height direction with a space interposed therebetween. The bottom wall 21 is shaped substantially circularly when the upper surface 21B of the bottom wall 21 is viewed in plan. The shape of the bottom wall 21 as viewed in plan is not limited to this but may be an oval, a polygon, or a combination thereof.

The standing wall 22 stands so as to extend in the height direction (e.g., the thickness direction) from the periphery of the bottom wall 21. The standing wall 22 is positioned above the bottom wall 21 (so as to be closer than the bottom wall 21 to the top wall 31) and surrounds the lower space 51. The standing wall 22 has an inside surface 22A facing the lower space 51, an outside surface 22B being opposite to the inside surface 22A, and an opposing surface 22C that connects between the inside surface 22A and the outside surface 22B at the top end of the standing wall 22. The inside surface 22A of the standing wall 22 is connected to the upper surface 21B of the bottom wall 21. The opposing surface 22C of the standing wall 22 opposes the circumferential portion of the piezoelectric diaphragm 10 in the height direction.

According to an example illustrated in FIG. 1, the standing wall 22 is not shaped like a continuous tube in the circumferential direction along the periphery of the bottom wall 21. Instead, the standing wall 22 is separated in the circumferential direction by at least one slit SLA. The slit SLA is formed from the top end to the bottom end of the standing wall 22, thereby exposing the upper surface 21B of the bottom wall 21. The slit SLA penetrates the standing wall 22 from the inside surface 22A to the outside surface 22B so as to open the lower space 51 to the exterior space. The slit SLA enables the standing wall 22 to be displaced easily in the radial direction. In exemplary aspects, multiple slits SLA having different widths in the circumferential direction may be formed in the standing wall 22. In the example illustrated in FIG. 1, the at-least-one slit SLA includes two slits SA1 and two slits SA2. In the circumferential direction, the width of each slit SA1 is larger than that of each slit SA2. The shape and the number of the at-least-one slit SLA is not limited to this exemplary configuration. For example, the slit SLA may open at the top end of the standing wall 22 and may be formed at a distance from the bottom wall 21. Moreover, the sizes of the multiple slits SLA may be different from each other as illustrated in FIG. 1. Alternatively, the multiple slits SLA may have the same size.

The standing wall 22 has a foot portion that is connected to the bottom wall 21 and a tapered portion that is formed at the top end of the foot portion. The tapered portion is shaped such that the thickness thereof in the radial direction becomes small gradually toward the top end of the standing wall 22. For purposes of the disclosure here, the "thickness" corresponds to the shortest distance between the inside surface 22A and the outside surface 22B of the standing wall 22. The inside surface 22A is bent at the border between the foot portion and the tapered portion of the standing wall 22 and inclines toward the outside surface 22B.

In addition, the protrusion 23 protrudes outward in the radial direction from the bottom wall 21 when the upper surface 21B of the bottom wall 21 is viewed in plan. The upper end of the protrusion 23, which is positioned closer to the top end of the standing wall 22, and the upper surface 21B of the bottom wall 21 are positioned on the same plane. The lower end of the protrusion 23, which is the end opposite to the end closer to the top end of the standing wall 22, is positioned above the lower surface 21A of the bottom wall 21 (e.g., at a position closer than the lower surface 21A to the upper surface 21B) and below the upper surface 21B (e.g., at a position closer than the upper surface 21B to the lower surface 21A).

According to an exemplary aspect, the base 20 is made of an insulating material, such as a ceramic material or a resin. For example, the resin material for forming the base 20 may be liquid crystal polymer (LCP), syndiotactic polystyrene (SPS), polyphenylene sulfide (PPS), or polybutylene terephthalate (PBT).

Next, a structure of the housing 30 will be described.

The housing 30 corresponds to an upper half portion of the container that is formed by fitting the base 20 and the housing 30 to each other and that retains the piezoelectric diaphragm 10 therein.

As shown, the top wall 31 and the piezoelectric diaphragm 10 form the upper space 52 therebetween. The top wall 31 opposes the bottom wall 21 so as to have the piezoelectric diaphragm 10 interposed therebetween. The top wall 31 that is shaped tabularly has a lower surface 31A and an upper surface 31B that are disposed opposite to each other. The lower surface 31A of the top wall 31 faces the interior space (i.e., the upper space 52) of the piezoelectric sound-producing component 100 and opposes the piezoelectric diaphragm 10 in the height direction with a space interposed therebetween. The upper surface 31B of the top wall 31 faces the outside of the piezoelectric sound-producing component 100. For example, the top wall 31 is shaped substantially circularly when the upper surface 31B of the top wall 31 is viewed in the plan view. It is noted that the shape of the top wall 31 as viewed in plan view is not limited to this but may be an oval, a polygon, or a combination thereof. In the exemplary aspect, the top wall 31 is larger than the bottom wall 21 and entirely overlaps the bottom wall 21.

Moreover, a sound emitting hole HL is formed at the top wall 31 and opens the upper space 52 to the exterior space. This configuration reduces interference in vibration of the piezoelectric diaphragm 10 due to compression and expansion in the upper space 52 and allows the sound produced by the piezoelectric diaphragm 10 to be emitted to the exterior space. The sound emitting hole HL is formed at a central portion of the top wall 31. Accordingly, when the upper surface 31B of the top wall 31 is viewed in the plan view, the sound emitting hole HL overlaps the piezoelectric vibrator element 13. When the upper surface 31B of the top wall 31 is viewed in plan, the sound emitting hole HL is shaped substantially circularly.

The circumferential wall 32 extends in the height direction from the periphery of the top wall 31. The circumferential wall 32 is formed below the top wall 31 (e.g., at a position closer than the top wall 31 to the bottom wall 21) so as to surround the upper space 52. The circumferential wall 32 of the housing 30 is positioned outside the base 20 in the radial direction. The circumferential wall 32 has an inside surface 32A facing the upper space 52, an outside surface 32B being opposite to the inside surface 32A, and an opposing surface 32C that is the surface of a step formed at the inside surface 32A. The inside surface 32A of the circumferential wall 32 is connected to the lower surface 31A of the top wall 31. The opposing surface 32C of the circumferential wall 32 opposes the circumferential portion of the piezoelectric diaphragm 10 in the height direction. The circumferential portion of the piezoelectric diaphragm 10 is nipped between the opposing surface 32C of the circumferential wall 32 and the opposing surface 22C of the standing wall 22 in the height direction.

In the example illustrated in FIG. 2, the bottom end of the circumferential wall 32, which is the end opposite to the top wall 31, is positioned side by side with the lower surface 21A of the bottom wall 21 in the radial direction. In other words, the bottom end of the circumferential wall 32 and the lower surface 21A of the bottom wall 21 are positioned on the same plane (e.g., in the horizontal direction). It is noted that the position of the bottom end of the circumferential wall 32 is not limited to this configuration, but may be lower than the lower surface 21A of the bottom wall 21 or may be higher than the lower surface 21A of the bottom wall 21.

At least one slit SLB is formed in the circumferential wall 32. The slit SLB is formed in the circumferential wall 32 from the end thereof at the opening of the housing 30. In other words, the bottom end of the circumferential wall 32 is divided by the slit SLB. The slit SLB is formed so as to be extend in the height direction. The slit SLB penetrates the circumferential wall 32 from the inside surface 32A to the outside surface 32B so as to open the lower space 51 to the exterior space. The slit SLB enables the circumferential wall 32 to be displaced easily in the radial direction. The slit SLB and the slit SLA are aligned with each other and thereby form a vent hole that opens the lower space 51 to the exterior space. This reduces interference in vibration of the piezoelectric diaphragm 10 due to compression and expansion in the lower space 51. It is noted that the circumferential wall 32 may have multiple slits SLB with different widths in the circumferential direction. In the example illustrated in FIG. 1, the at-least-one slit SLB includes two slits SB1 and two slits SB2. The width of each slit SB1 in the circumferential direction is designed so as to fit the width of the corresponding slit SA1, and the width of each slit SB2 in the circumferential direction is designed so as to fit the width of the corresponding slit SA2. Accordingly, in the circumferential direction, the width of each slit SB1 is larger than that of each slit SB2. As is the case for the slit SLA, the shapes and the number of the slits SLB are not limited to those illustrated in the example of FIG. 1.

The hook portion 33 is formed at the inside surface 32A of the circumferential wall 32 to serve to lock the protrusion 23 of the base 20. When the lower surface 31A of the top wall 31 is viewed in plan, the hook portion 33 protrudes inward from the circumferential wall 32 in the radial direction. According to the exemplary aspect, the hook portion 33 engages the protrusion 23 and thereby prevents the housing 30 from coming off the base 20.

The housing 30, like the base 20, is made of an insulating material, such as a ceramic material or a resin, according to an exemplary aspect. The housing 30 may be made of the same material as that of the base 20. Accordingly, the amount of heat deformation of the housing 30 (e.g., the amount of deformation of the circumferential wall 32 deformed outward in the radial direction) due to the heat of flow soldering, for example, is thereby made closer to the amount of heat deformation of the base 20 (e.g., the amount of deformation of the standing wall 22 deformed outward in the radial direction).

Next, the mounting terminal 40 will be described.

The first terminal 41 and the second terminal 42 penetrate the bottom wall 21. The first terminal 41 and the second terminal 42 extend like needles from the lower surface 21A of the bottom wall 21 into the exterior space in a direction intersecting the lower surface 21A. The first terminal 41 and the second terminal 42 are bent in the lower space 51 so as to act like springs. An end of the first terminal 41 is in contact with the diaphragm 11, and the first terminal 41 is thereby electrically connected to the first electrode E1. An end of the second terminal 42 is in contact with the second electrode E2, and the second terminal 42 is thereby electrically connected to the second electrode E2. Upward restoring forces acting on the first terminal 41 and the second terminal 42 in the lower space 51 maintain electrical connection between the first terminal 41 and the first electrode E1 and also between the second terminal 42 and the second electrode E2 even when the piezoelectric diaphragm 10 vibrates. For example, the first terminal 41 and the second terminal 42 are formed of plated phosphor-bronze wires having a substantially circular cross section.

Figure 3:
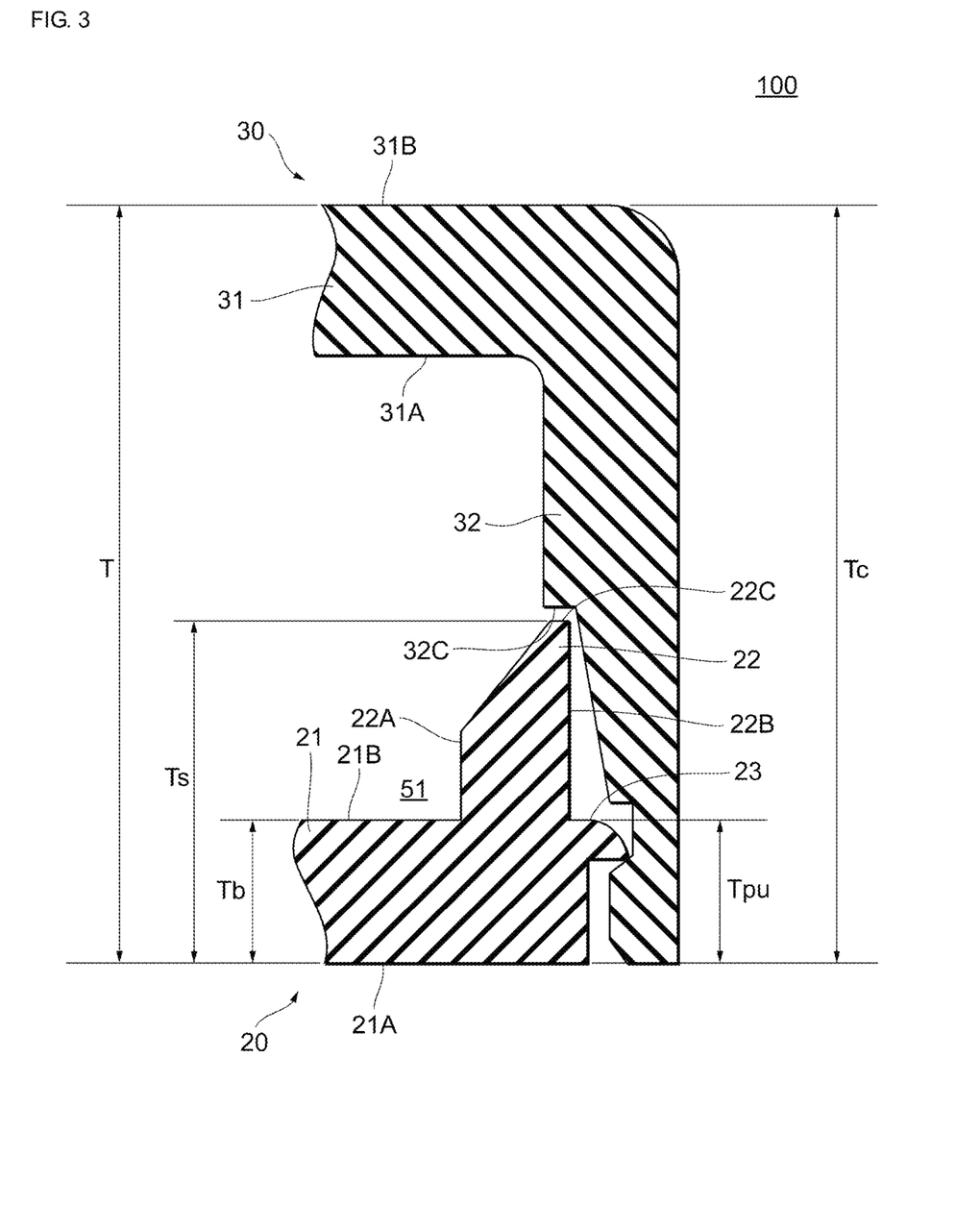
FIG. 3 is an enlarged cross-sectional view schematically illustrating a structure of a base in the vicinity of a locking portion according to the first exemplary embodiment.
Figure 4:
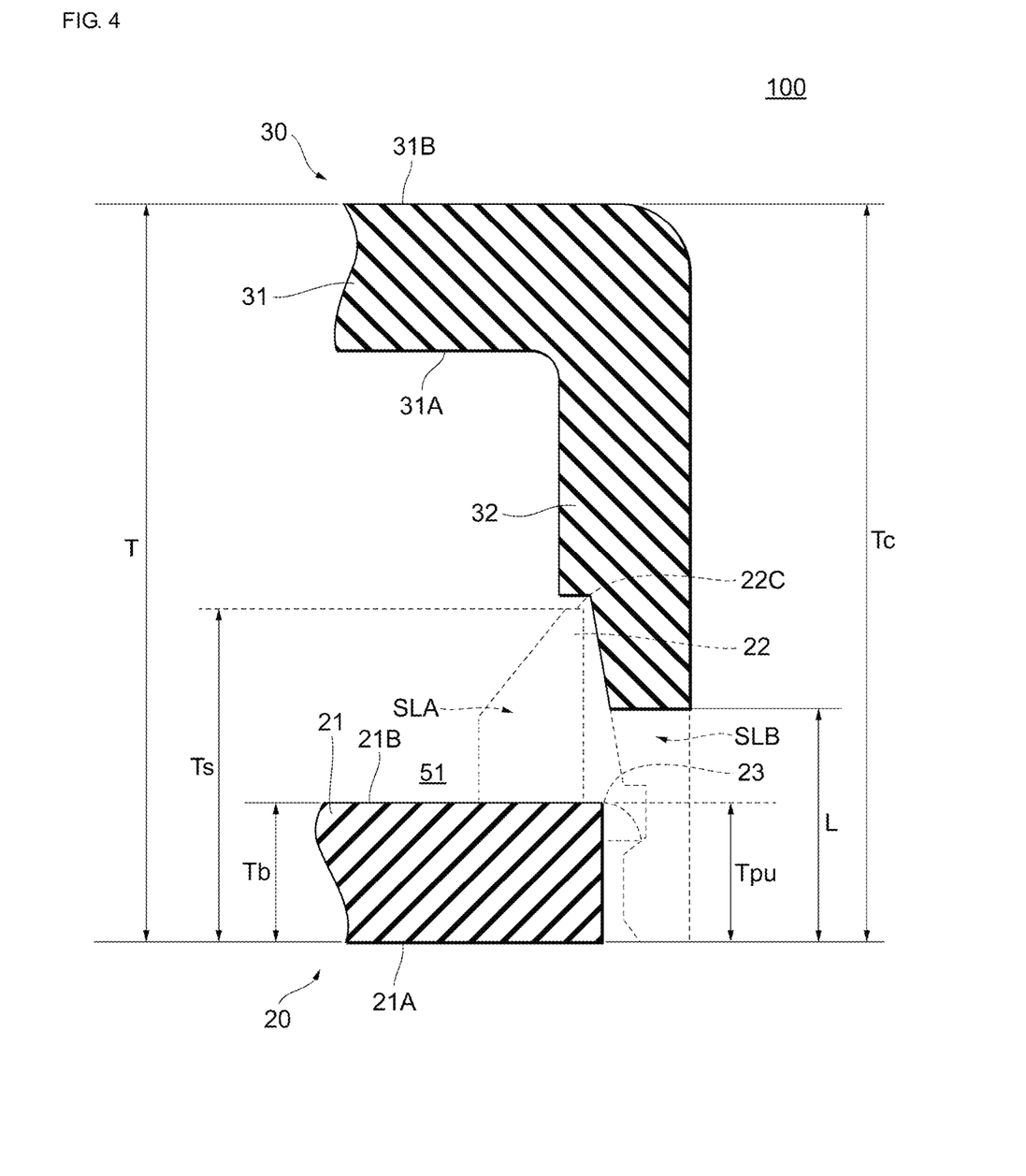
FIG. 4 is an enlarged cross-sectional view schematically illustrating structures of the base and a housing in the vicinity of a vent hole according to the first exemplary embodiment.

Next, the structure of the slit SLB and the structure of the protrusion 23 according to the present embodiment will be described in detail with reference to FIGS. 3 and 4. FIG. 3 is an enlarged cross-sectional view schematically illustrating a structure of the base in the vicinity of a locking portion according to the first embodiment. FIG. 4 is an enlarged cross-sectional view schematically illustrating structures of the base and the housing in the vicinity of the vent hole according to the first embodiment. It is noted that illustration of the piezoelectric diaphragm 10 is omitted in FIGS. 3 and 4.

The height of the piezoelectric sound-producing component 100 (hereinafter referred to as the "overall height") is denoted by reference sign T. The overall height T corresponds to the shortest distance between the lower surface 21A of the bottom wall 21 and the upper surface 31B of the top wall 31. The length of the slit SLB in the height direction (hereinafter referred to as the "slit length") is denoted by reference sign L, and the length of the housing 30 in the height direction (hereinafter referred to as the "housing length") is denoted by reference sign Tc. The slit length L corresponds the shortest distance between the opening end of the slit SLB at the bottom end of the circumferential wall 32 and the top end of the slit SLB positioned closer to the top wall 31. The housing length Tc corresponds to the shortest distance between the bottom end of the circumferential wall 32 and the upper surface 31B of the top wall 31. The thickness of the bottom wall 21 in the height direction (hereinafter referred to as the "bottom-wall thickness") is denoted by reference sign Tb. The height of the upper end of the protrusion 23 positioned closer to the top end of the standing wall 22 (hereinafter referred to as the "upper-end height") is denoted by reference sign Tpu. In addition, the height of the opposing surface 22C of the standing wall 22 (hereinafter referred to as the "opposing-surface height") is denoted by reference sign Ts. The bottom-wall thickness Tb corresponds to the shortest distance between the lower surface 21A and the upper surface 21B of the bottom wall 21. The upper-end height Tpu corresponds to the shortest distance between the lower surface 21A of the bottom wall 21 and the upper end of the protrusion 23. The opposing-surface height Ts corresponds to the shortest distance between the lower surface 21A of the bottom wall 21 and the opposing surface 22C of the standing wall 22. In addition, the opposing-surface height Ts corresponds to the length of the base 20 in the height direction. It is noted that in the example illustrated in FIG. 3, the housing length Tc is substantially equal to the overall height T because the bottom end of the circumferential wall 32 and the lower surface 21A of the bottom wall 21 are positioned on the same plane.

From the viewpoint of reducing the flexibility of the circumferential wall 32 and thereby improving the connection strength, the slit length L is less than 0.35 times the housing length Tc (L<0.35×Tc) and preferably 0.3 times the housing length Tc or less (L≤0.3×Tc). The slit length L is smaller than the opposing-surface height Ts (L<Ts). Put another way, the upper end of the slit SLB is positioned below the top end (the opposing surface 22C) of the standing wall 22, in other words, positioned closer than the top end of the standing wall 22 to the bottom wall 21. In the example illustrated in FIG. 4, the upper end of the slit SLB is positioned below the tapered portion of the standing wall 22, in other words, positioned closer than the tapered portion to the lower surface 21A of the bottom wall 21 of the standing wall 22. Accordingly, the upper end of the slit SLB is positioned on the same plane on which the lower surface 21A of the bottom wall 21 of the standing wall 22 is positioned.

From the viewpoint of providing the vent hole of the lower space 51 that is formed so as to align the slit SLA and the slit SLB with each other, the slit length L is preferably greater than 0.15 times the housing length Tc (0.15×Tc<L), and more preferably greater than the bottom-wall thickness Tb (Tb<L). Put another way, the upper end of the slit SLB is preferably positioned above the bottom wall 21, in other words, preferably positioned closer than the bottom wall 21 to the top end (the opposing surface 22C) of the standing wall 22. The upper end of the slit SLB is preferably positioned above the upper end of the protrusion 23, in other words, positioned closer than the upper end of the protrusion 23 to the top end of the standing wall 22. It is noted that when providing an additional opening of the lower space 51 other than the slit SLB, the slit length L may be smaller than 0.15 times the housing length Tc and may be smaller than or equal to the bottom-wall thickness Tb in alternative aspects. In the example illustrated in FIG. 4, the slit length L is greater than the upper-end height Tpu. The slit length L, however, may be smaller than or equal to the upper-end height Tpu.

From the viewpoint of reducing the stress transferred from the circumferential wall 32 to the standing wall 22 and thereby reducing displacement of the opposing surface 22C, the upper-end height Tpu is set to be equal to the bottom-wall thickness Tb (Tpu=Tb) in the present embodiment. In other words, the upper end of the protrusion 23 and the upper surface 21B of the bottom wall 21 are positioned on the same plane. This can cause the piezoelectric diaphragm 10 to be nipped stably and reduce the difference in vibration characteristics among individual products.

Example

Figure 5:
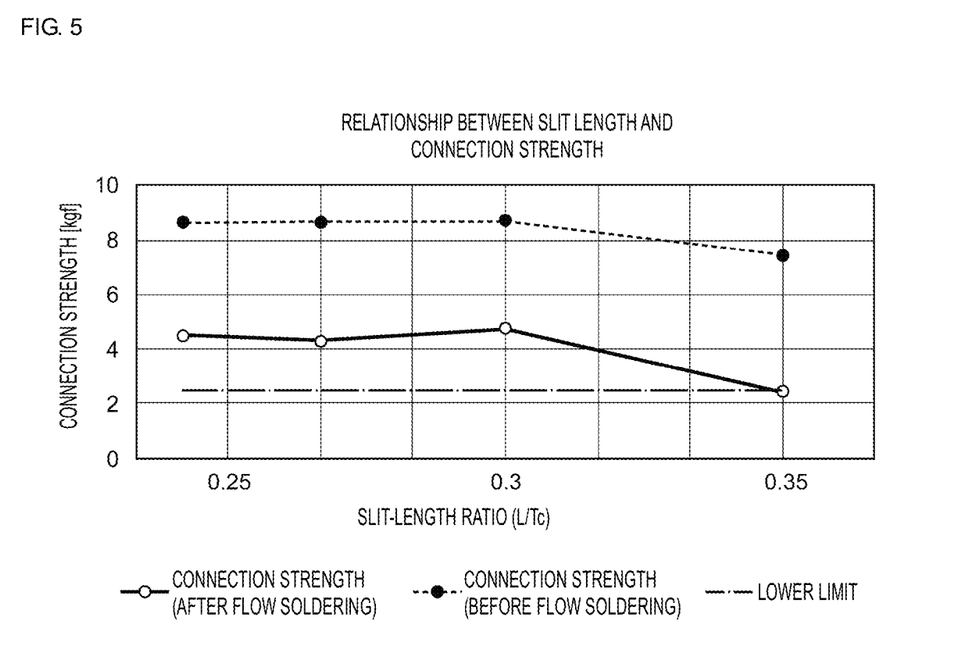
FIG. 5 is a graph depicting a relationship between a slit-length ratio and a connection strength in an example of the first exemplary embodiment.

An example of the first embodiment will be described with reference to FIG. 5. FIG. 5 is a graph depicting a relationship between a slit-length ratio and a connection strength in the example of the first embodiment. In the graph of FIG. 5, the horizontal axis represents the ratio of the slit length L to the housing length Tc (hereinafter referred to as the "slit-length ratio (L/Tc)"), and the vertical axis represents the connection strength of the housing 30.

As shown, FIG. 5 plots the change in the connection strength with respect to the slit-length ratio (L/Tc) when the slit length L is changed, in which the overall height T=6.0 mm, the housing length Tc=6.0 mm, the bottom-wall thickness Tb=1.0 mm, the upper-end height Tpu=1.0 mm, and the opposing-surface height Ts=2.15 mm. In FIG. 5, the connection strength after flow soldering is compared with the connection strength before flow soldering. Here, the terms "before flow soldering" and "after flow soldering" refer to the states before and after the piezoelectric sound-producing component 100 is subjected to flow soldering using a solder bath.

The connection strength after flow soldering decreases compared with the connection strength before flow soldering. In the case of the connection strength after flow soldering exceeding the lower limit, the likelihood of the housing 30 coming off can be reduced. In the present example, when the slit-length ratio (L/Tc) is 0.35 or more, the connection strength after flow soldering is below the lower limit. Accordingly, setting the slit-length ratio (L/Tc) to be less than 0.35 can reduce the likelihood of the housing 30 coming off. In addition, in the range of L/Tc≤0.3, the connection strength is substantially constant irrespective of the slit-length ratio (L/Tc), whereas in the range of 0.3<L/Tc, the connection strength decreases as the slit-length ratio (L/Tc) increases. Accordingly, designing the slit-length ratio (L/Tc) to satisfy L/Tc≤0.3 can provide sufficient connection strength while reducing the fluctuation in the connection strength caused by variation occurring in the manufacturing process.

As described above, the piezoelectric sound-producing component 100 according to the first embodiment includes the base 20, the housing 30, and the piezoelectric diaphragm 10 accommodated in the interior space formed by fitting the base 20 and the housing 30 to each other. The base 20 has the protrusion, and the housing 30 has the hook portion to serve to lock the protrusion. At least one slit SLB is formed in the circumferential wall 32 of the housing 30. The slit length L and the housing length Tc satisfy the relation L<0.35×Tc.

This configuration reduces the flexibility of the circumferential wall 32 and thereby improves the connection strength. This configuration also provides sufficient connection strength between the base 20 and the housing 30 even if the base 20 and the housing 30 are softened or deformed by the heat of flow soldering, and accordingly reduces the likelihood of the housing 30 coming off during flow soldering.

Structures of piezoelectric sound-producing components according to additional exemplary embodiments of the present invention will now be described. Note that in the description of the following embodiments, the points that are different from those described in the first embodiment will be focused on, and the same points as those described previously will be omitted. The same advantageous effects obtained from the same configurations will not be described repeatedly.

Second Exemplary Embodiment

Figure 6:
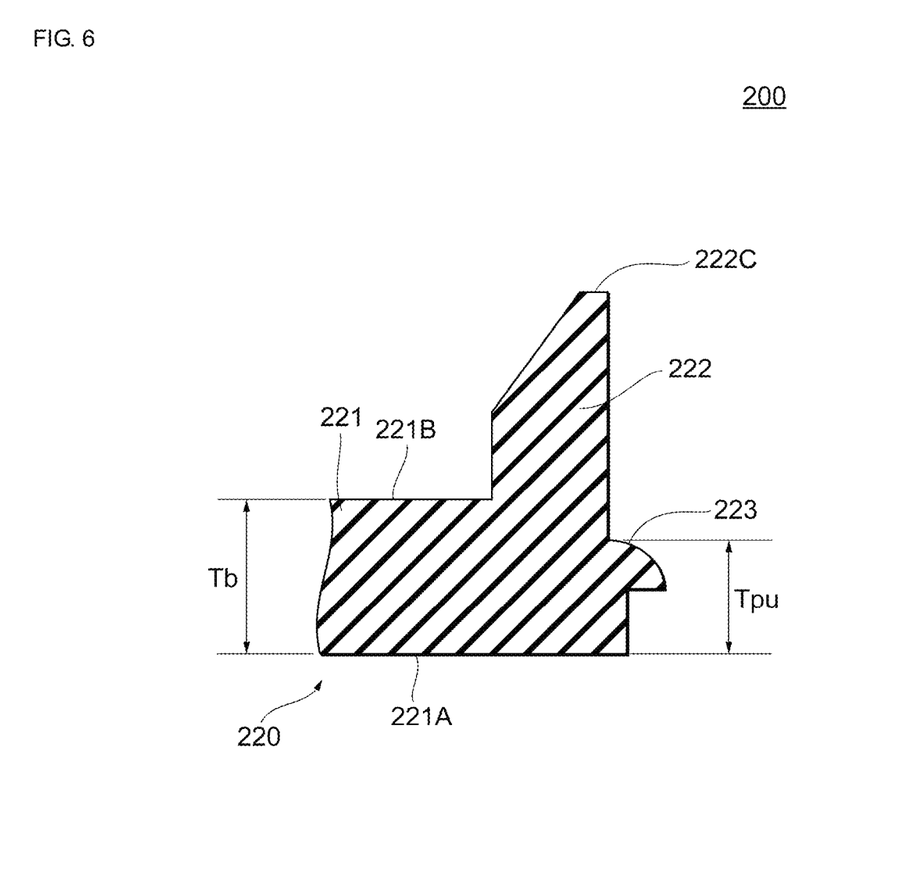
FIG. 6 is an enlarged cross-sectional view schematically illustrating a structure of a base in the vicinity of a locking portion according to a second exemplary embodiment.

A structure of a piezoelectric sound-producing component 200 according to the second embodiment will be described with reference to FIG. 6. FIG. 6 is an enlarged cross-sectional view schematically illustrating a structure of a base in the vicinity of a locking portion according to the second embodiment.

As is the case for the piezoelectric sound-producing component 100 of the first embodiment, the piezoelectric sound-producing component 200 according to the second embodiment includes a bottom wall 221 having a lower surface 221A and an upper surface 221B, a standing wall 222 having an opposing surface 222C, and a protrusion 223.

The second embodiment is different from the first embodiment in that the upper-end height Tpu is smaller than the bottom-wall thickness Tb (Tpu<Tb). Put another way, the upper end of the protrusion 223 is positioned below the upper surface 221B of the bottom wall 221. In other words, it is positioned closer than the upper surface 221B to the lower surface 221A of the bottom wall 221. The entire protrusion 223 adjoins the bottom wall 221 in the circumferential direction. When Tpu<Tb, the displacement of the opposing surface 222C of the standing wall 222 is further reduced.

Third Exemplary Embodiment

Figure 7:
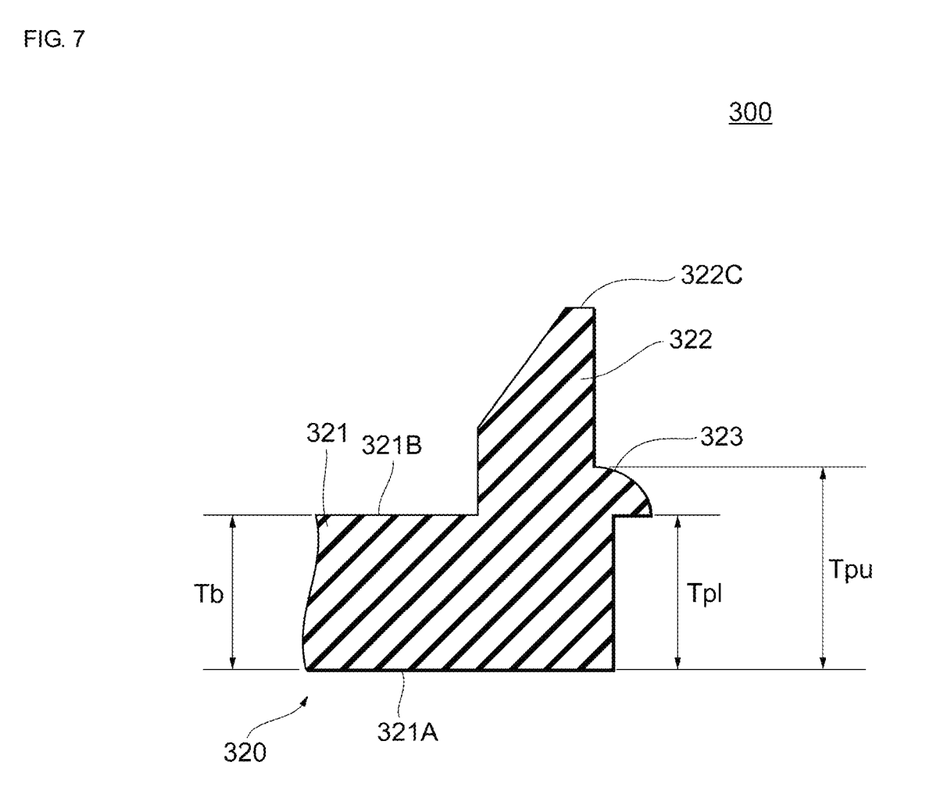
FIG. 7 is an enlarged cross-sectional view schematically illustrating a structure of a base in the vicinity of a locking portion according to a third exemplary embodiment.

A structure of a piezoelectric sound-producing component 300 according to the third embodiment will be described with reference to FIG. 7. FIG. 7 is an enlarged cross-sectional view schematically illustrating a structure of a base in the vicinity of a locking portion according to the third embodiment.

As is the case for the piezoelectric sound-producing component 100 of the first embodiment, the piezoelectric sound-producing component 300 according to the third embodiment includes a bottom wall 321 having a lower surface 321A and an upper surface 321B, a standing wall 322 having an opposing surface 322C, and a protrusion 323.

The third embodiment is different from the first embodiment in that the upper-end height Tpu is greater than the bottom-wall thickness Tb (Tpu>Tb). Put another way, the upper end of the protrusion 323 is positioned above the upper surface 321B of the bottom wall 321. In other words, it is positioned closer than the upper surface 321B of the bottom wall 321 to the top end (the opposing surface 322C) of the standing wall 322. In the example illustrated in FIG. 7, when the height of the lower end of the protrusion 323 from the lower surface 321A of the bottom wall 321 (hereinafter referred to as the "lower-end height") is denoted by reference sign Tpl, the lower-end height Tpl is greater than the bottom-wall thickness Tb (Tb<Tpl). Put another way, the lower end of the protrusion 323 is positioned above the upper surface 321B of the bottom wall 321. In other words, it is positioned closer than the upper surface 321B of the bottom wall 321 to the top end of the standing wall 322. It is also noted that the position of the lower end of the protrusion 323 is not limited to this but may be such that the lower-end height Tpl is equal to the bottom-wall thickness Tb (Tpl=Tb). In other words, the lower end of the protrusion 323 and the upper surface 321B of the bottom wall 321 may be positioned on the same plane. Moreover, the lower-end height Tpl may be smaller than the bottom-wall thickness Tb (Tpl<Tb). Put another way, the lower end of the protrusion 323 may be positioned below the upper surface 321B of the bottom wall 321, in other words, positioned closer than the upper surface 321B to the lower surface 321A of the bottom wall 321. When Tpu>Tb, the standing wall 322 is displaced inward in the radial direction during engagement, which generates restoring forces that displace the protrusion 323 outward in the radial direction. This further improves the connection strength.

A portion or the whole of the exemplary embodiments of the present invention will be given below as a supplementary note, and advantageous effects thereof will be described. The present invention, however, is not limited to the supplementary note given below.

The piezoelectric sound-producing component according to an exemplary aspect includes the piezoelectric diaphragm, the base having the terminal that electrically couples the piezoelectric diaphragm with an external device, and the housing that is combined with the base and thereby accommodates the piezoelectric diaphragm. The base includes the bottom wall having the upper surface that opposes the piezoelectric diaphragm with a space interposed therebetween and also includes the protrusion that protrudes outward from the bottom wall when the upper surface is viewed in plan. The housing includes the top wall having the lower surface that opposes the piezoelectric diaphragm with a space interposed therebetween and also includes the circumferential wall that extends in the height direction of the piezoelectric sound-producing component. The circumferential wall has the hook portion configured to lock the protrusion of the base. At least one slit is formed in the circumferential wall of the housing so as to extend from the end of the housing at the opening of the housing. When L denotes the length of the at least one slit in the height direction of the piezoelectric sound-producing component and Tc denotes the length of the housing in the height direction of the piezoelectric sound-producing component, the piezoelectric sound-producing component satisfies the relation L<0.35×Tc.

With this configuration, the flexibility of the circumferential wall is reduced, and the connection strength is thereby improved. A sufficient connection strength between the base and the housing can be obtained even if the base and the housing are softened or deformed especially due to the heat of, for example, flow soldering after the housing and the base are connected together, and accordingly the likelihood of the housing coming off can be reduced.

In an exemplary aspect, the piezoelectric sound-producing component satisfies the relation L≤0.3×Tc.

This configuration further improves the connection strength. The fluctuation of the connection strength due to variation of the slit length occurring in the manufacturing process can also be reduced.

Moreover, in an exemplary aspect, the piezoelectric sound-producing component satisfies the relation 0.15× Tc<L.

This configuration enables the slit of the base and the slit of the housing to be aligned with each other, and the vent hole can be thereby formed so that the interior space (i.e., the lower space) surrounded by the piezoelectric diaphragm and the base can be opened to the exterior space.

In the piezoelectric sound-producing component, the base can further include the standing wall that extends in the height direction of the piezoelectric sound-producing component. The standing wall and the circumferential wall can have respective opposing surfaces that oppose an circumferential portion of the piezoelectric diaphragm. In addition, the piezoelectric diaphragm can be nipped between the opposing surfaces of the standing wall and the circumferential wall.

In the piezoelectric sound-producing component, the bottom wall of the base can have the lower surface that is positioned oppositely to the piezoelectric diaphragm. In this aspect, when Tb denotes the thickness of the bottom wall in the height direction of the piezoelectric sound-producing component and Tpu denotes the height, in the height direction of the piezoelectric sound-producing component, from the lower surface of the bottom wall to the upper end of the protrusion that protrudes from the bottom wall, the piezoelectric sound-producing component satisfies the relation Tpu Tb.

With this configuration, the stress transferred from the circumferential wall to the standing wall can be reduced, which can reduce the displacement of the opposing surface of the standing wall. Accordingly, the piezoelectric diaphragm can be nipped stably, and the difference in vibration characteristics among individual products can be reduced.

In the piezoelectric sound-producing component, the bottom wall of the base can also have the lower surface that is positioned oppositely to the piezoelectric diaphragm. In this aspect, when Tb denotes the thickness of the bottom wall in the height direction of the piezoelectric sound-producing component and Tpu denotes the height, in the height direction of the piezoelectric sound-producing component, from the lower surface of the bottom wall to the upper end of the protrusion that protrudes from the bottom wall, the piezoelectric sound-producing component satisfies the relation Tpu>Tb.

With this configuration, the standing wall is displaced inward in the radial direction during engagement of the housing and the base, which generates restoring forces that displace the protrusion outward in the radial direction. This further improves the connection strength.

The piezoelectric sound-producing component according to another exemplary aspect includes the piezoelectric diaphragm, the base having the terminal that electrically couples the piezoelectric diaphragm with an external device, and the housing that is combined with the base and thereby accommodates the piezoelectric diaphragm. The base includes the bottom wall having the upper surface that opposes the piezoelectric diaphragm with a space interposed therebetween, the protrusion that protrudes outward from the bottom wall when the upper surface is viewed in plan, and the standing wall that extends in the height direction of the piezoelectric sound-producing component. The housing includes the top wall having the lower surface that opposes the piezoelectric diaphragm with a space interposed therebetween and also includes the circumferential wall that extends in the height direction of the piezoelectric sound-producing component. The circumferential wall has the hook portion configured to lock the protrusion of the base. At least one slit is formed in the circumferential wall of the housing so as to extend from the end of the housing at the opening of the housing. When the housing is combined with the base, the upper end of the at least one slit is positioned below the top end of the standing wall.

With this configuration, the flexibility of the circumferential wall can be reduced, and the connection strength can be thereby improved. A sufficient connection strength between the base and the housing can be obtained even if the base and the housing are softened or deformed especially due to the heat of, for example, flow soldering after the housing and the base are connected together, and accordingly the likelihood of the housing coming off can be reduced.

In the piezoelectric sound-producing component, the upper end of the at least one slit can be positioned above the upper surface of the bottom wall.

This configuration enables the slit of the base and the slit of the housing to be aligned with each other, and the vent hole can be thereby formed so that the interior space (the lower space) surrounded by the piezoelectric diaphragm and the base can be opened to the exterior space.

In the piezoelectric sound-producing component, the upper end of the at least one slit can be positioned above the upper end of the protrusion.

With this configuration, the vent hole can be formed so as to have a sufficient size.

In the piezoelectric sound-producing component, the standing wall can also have the tapered portion of which the thickness gradually decreases toward the top end of the standing wall, and the upper end of the at least one slit may be positioned below the tapered portion of the standing wall.

With this configuration, the flexibility of the circumferential wall can be reduced, and the connection strength can be thereby improved.

As described above, according to an exemplary aspect, the piezoelectric sound-producing component is provided with improved reliability.

In general, it is noted that the exemplary embodiments described are provided to facilitate understanding of the present invention and are not intended to interpret the present invention in a limited manner. Thus, the present invention may be altered and modified without departing from the gist thereof. The present invention includes equivalents thereof. In other words, a design change made by those skilled in the art on the basis of any of the embodiments falls within the scope of the present invention insofar as such a design change incorporates features of the present invention. For example, arrangement, material, condition, shape, size, or the like, of each element included in each embodiment are not limited to what has been described by way of example and may be changed appropriately. In addition, the elements included in the above embodiments may be combined with one another insofar as such a combination is technically appropriate. Such a combination is also included within the scope of the present invention insofar as the combination incorporates features of the present invention.

REFERENCE SIGNS LIST 100 piezoelectric sound-producing component
10 piezoelectric diaphragm
11 diaphragm
13 piezoelectric vibrator element
20 base
21 bottom wall
22 standing wall
23 protrusion
30 housing
31 top wall
32 circumferential wall
33 hook portion
40 mounting terminal
Tb bottom-wall thickness
Tpu upper-end height
Tc housing length
L slit length

The invention claimed is:

1. A piezoelectric sound-producing component, comprising:
   a piezoelectric diaphragm;
   a base having a terminal that is coupled to the piezoelectric diaphragm; and
   a housing that is combined with the base to accommodate the piezoelectric diaphragm,
   wherein the base includes a bottom wall having an upper surface that opposes the piezoelectric diaphragm with a space interposed therebetween and a protrusion that protrudes outward from the bottom wall,
   wherein the housing includes a top wall having a lower surface that opposes the piezoelectric diaphragm with a space interposed therebetween and a circumferential wall that extends in a height direction of the piezoelectric sound-producing component,
   wherein the circumferential wall has a hook portion configured to lock the protrusion of the base,
   wherein at least one slit is disposed in the circumferential wall of the housing so as to extend from an end of the housing at an opening of the housing,
   wherein L denotes a length of the at least one slit in the height direction and Tc denotes a length of the housing in the height direction, and
   wherein $L<0.35 \times Tc$,
   wherein the bottom wall of the base has a lower surface that is positioned opposite to the piezoelectric diaphragm,
   wherein Tb denotes a thickness of the bottom wall in the height direction and Tpu denotes a height from the lower surface of the bottom wall to an upper end of the protrusion in the height direction, and
   wherein $Tpu<Tb$.

2. The piezoelectric sound-producing component according to claim 1, wherein the terminal electrically couples the piezoelectric diaphragm with an external device.

3. The piezoelectric sound-producing component according to claim 1, wherein $L \leq 0.3 \times Tc$.

4. The piezoelectric sound-producing component according to claim 1, wherein $0.15 \times Tc < L$.

5. The piezoelectric sound-producing component according to claim 1,
   wherein the base further includes a standing wall that extends in the height direction of the piezoelectric sound-producing component,
   wherein the standing wall and the circumferential wall have respective opposing surfaces that oppose a circumferential portion of the piezoelectric diaphragm, and
   wherein the piezoelectric diaphragm is nipped between the opposing surfaces of the standing wall and the circumferential wall.

6. The piezoelectric sound-producing component according to claim 1, wherein the protrusion protrudes outward from the bottom wall in a lateral direction parallel to the upper surface of the bottom wall.

7. The piezoelectric sound-producing component according to claim 1, wherein the hook portion comprises an indentation extending into an inner surface of the circumferential wall.

8. The piezoelectric sound-producing component according to claim 7, wherein the indentation comprises a lateral surfaces that engages a lateral surface of the protrusion, with each respective lateral surface extending in a direction orthogonal to the height direction.

9. The piezoelectric sound-producing component according to claim 1, further comprising a sound emitting hole disposed in an upper surface of the housing to overlap the piezoelectric diaphragm relative to the height direction.

10. A piezoelectric sound-producing component, comprising:
    a piezoelectric diaphragm;
    a base having a terminal coupled to the piezoelectric diaphragm; and
    a housing that is combined with the base to accommodate the piezoelectric diaphragm,
    wherein the base includes a bottom wall having an upper surface that opposes the piezoelectric diaphragm with a space interposed therebetween, a protrusion that protrudes outward from the bottom wall, and a standing wall that extends in a height direction of the piezoelectric sound-producing component,
    wherein the housing includes a top wall having a lower surface that opposes the piezoelectric diaphragm with a space interposed therebetween and a circumferential wall that extends in the height direction,
    wherein the circumferential wall has a hook portion configured to lock the protrusion of the base,
    wherein at least one slit is disposed in the circumferential wall of the housing so as to extend from an end of the housing at an opening of the housing, and
    wherein, when the housing is combined with the base, an upper end of the at least one slit is positioned below a top end of the standing wall
    wherein the bottom wall of the base has a lower surface that is positioned opposite to the piezoelectric diaphragm,
    wherein Tb denotes a thickness of the bottom wall in the height direction and Tpu denotes a height from the lower surface of the bottom wall to an upper end of the protrusion in the height direction, and
    wherein $Tpu<Tb$.

11. The piezoelectric sound-producing component according to claim 10, wherein the terminal electrically couples the piezoelectric diaphragm with an external device.

12. The piezoelectric sound-producing component according to claim 10, wherein the upper end of the at least one slit is positioned above the upper surface of the bottom wall.

13. The piezoelectric sound-producing component according to claim 10, wherein the upper end of the at least one slit is positioned above an upper end of the protrusion.

14. The piezoelectric sound-producing component according to claim 10, wherein the standing wall has a tapered portion that gradually decreases in thickness towards the top end of the standing wall.

15. The piezoelectric sound-producing component according to claim 14, wherein the upper end of the at least one slit is positioned below the tapered portion of the standing wall.

16. The piezoelectric sound-producing component according to claim 10, wherein the hook portion comprises an indentation extending into an inner surface of the circumferential wall.

17. The piezoelectric sound-producing component according to claim 16, wherein the indentation comprises a lateral surfaces that engages a lateral surface of the protrusion, with each respective lateral surface extending in a direction orthogonal to the height direction.

18. The piezoelectric sound-producing component according to claim 10, further comprising a sound emitting hole disposed in an upper surface of the housing to overlap the piezoelectric diaphragm relative to the height direction.

* * * * *